United States Patent [19]

Kubota et al.

[11] Patent Number: 5,332,880
[45] Date of Patent: Jul. 26, 1994

[54] METHOD AND APPARATUS FOR GENERATING HIGHLY DENSE UNIFORM PLASMA BY USE OF A HIGH FREQUENCY ROTATING ELECTRIC FIELD

[75] Inventors: Masafumi Kubota; Kenji Harafuji; Tokuhiko Tamaki; Mitsuhiro Ohkuni, all of Osaka; Noboru Nomura, Kyoto; Ichiro Nakayama, Osaka, all of Japan

[73] Assignee: Matsushita Electric Industrial Co., Ltd., Osaka, Japan

[21] Appl. No.: 40,348

[22] Filed: Mar. 30, 1993

[30] Foreign Application Priority Data

Mar. 31, 1992 [JP] Japan .................. 4-077720

[51] Int. Cl.⁵ .................. B23K 9/00; H01L 21/306
[52] U.S. Cl. .................. 219/121.52; 219/121.43; 219/121.54; 219/121.44; 156/345; 156/646; 204/298.08; 204/298.34; 204/298.31
[58] Field of Search .................. 219/121.52, 121.54, 219/121.43, 121.44; 156/646, 345; 204/298.16, 298.37, 298.38, 298.34, 298.08

[56] References Cited

U.S. PATENT DOCUMENTS 4,253,907  3/1981  Parry et al. .................. 219/121.43
4,724,296  2/1988  Moriey .................. 219/121.43

FOREIGN PATENT DOCUMENTS 0056076   4/1985  Japan .................. 219/121.43
60-153129 8/1985  Japan .
62-44576  2/1987  Japan .
62-273731 11/1987 Japan .
3-30424   2/1991  Japan .

Primary Examiner—Mark H. Paschall
Attorney, Agent, or Firm—Willian Brinks Hofer Gilson & Lione

[57] ABSTRACT

At lateral sides of a plasma generating part under a vacuum, first to fourth lateral electrodes are so disposed as to surround the plasma generating part. High frequency electric power is supplied to the first lateral electrode from a first high frequency power supply, high frequency electric power is supplied to the second lateral electrode from the first high frequency power supply through a first delay circuit, high frequency electric power is supplied to the third lateral electrode from the first high frequency power supply through the first delay circuit and through a second delay circuit, and high frequency electric power is supplied to the fourth lateral electrode from the first high frequency power supply through the first and second delay circuits and through a third delay circuit. Accordingly, there are respectively applied, to the first to fourth lateral electrodes, the high frequency electric powers of which frequencies are equal to one another and of which phases are successively different from one another, and there is excited, in the plasma generating part, a rotational electric field to cause electrons in the plasma generating part to present rotational motions.

19 Claims, 16 Drawing Sheets

+10G

+5G

−5G

-10G

-20G

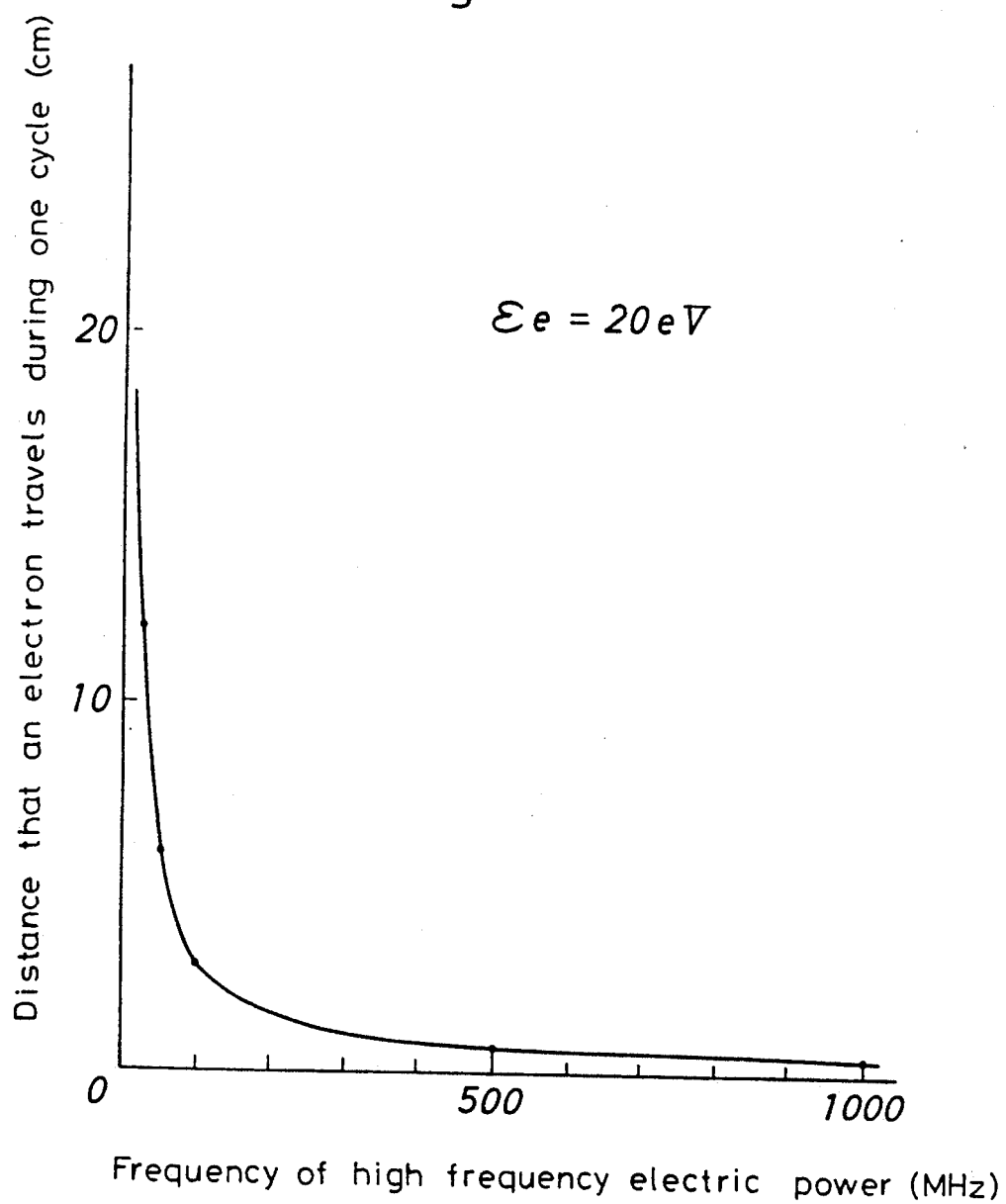

Fig. 12

|  | Conventional Etching | | | Etching of the present invention |
|---|---|---|---|---|
|  | Parallel Plate RIE | Magnetron RIE | ECR etching |  |
| Anisotropy | △ | ○ | ○ | ○ |
| Uniformity | ○ | △ | △ | ○ |
| Damage | △ | △ | ○ | ○ |
| Selectivity | △ | ○ | ○ | ○ |
| Etch rate | △ | ○ | △ | ○ |
| Applicability to greater diameter | ○ | △ | △ | ○ |

△ : Average

○ : Good

Fig.13
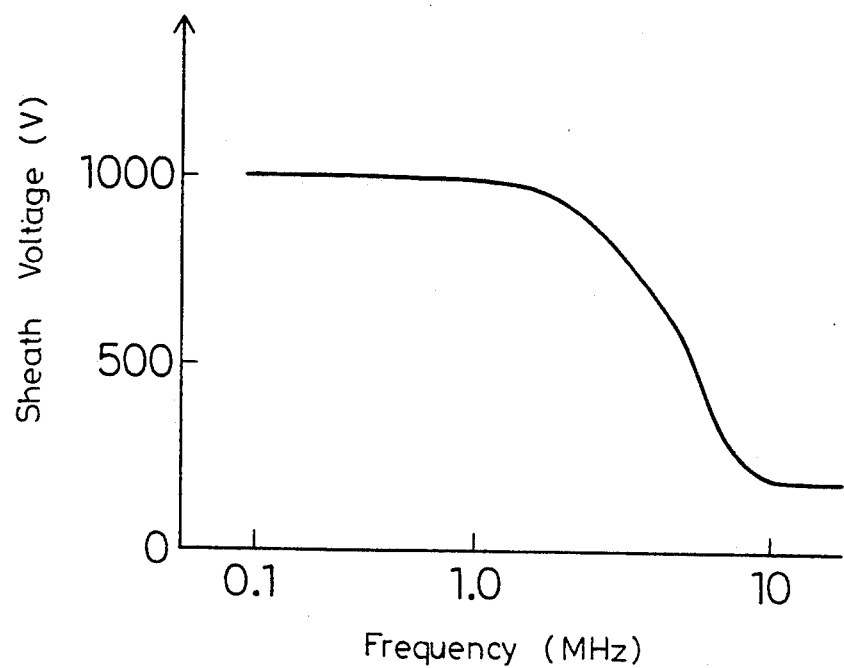
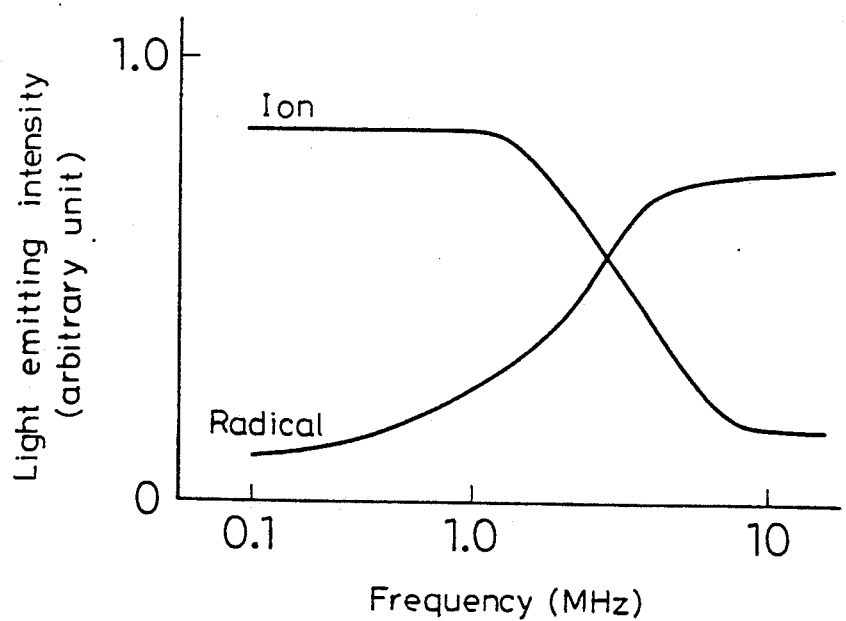

METHOD AND APPARATUS FOR GENERATING HIGHLY DENSE UNIFORM PLASMA BY USE OF A HIGH FREQUENCY ROTATING ELECTRIC FIELD

BACKGROUND OF THE INVENTION

The present invention relates to a plasma generating method and apparatus.

A plasma generating method using high frequency electric discharge is used in the fields of dry-etching apparatus for microfabrication, plasma CVD apparatus or sputtering apparatus for forming thin films, ion implantation apparatus and the like. In such a plasma generating method, it is required to generate a plasma under a high vacuum in order to miniaturize the feature sizes or to control the film quality with high precision.

The following will discuss a dry etching method for microfabrication as an example of application of the plasma generating method.

The recent progress in the field of highly dense semiconductor integrated circuits is bringing about great changes equivalent to those brought by the Industrial Revolution. The highly dense arrangement of a semiconductor integrated circuit has been achieved by miniaturization of element dimensions, improvements in devices, provision of large-area chips and the like. Element dimensions are now miniaturized to the extent of the wavelength of light. In lithography, the use of excimer laser or soft X-ray is taken into consideration. To realize micro-patterns, dry etching plays an important role as lithography does.

Dry etching is a process technology for removing unnecessary parts of a thin film or a substrate with the use of chemical or physical reactions on the surface of a gas-solid phase of radicals, ions or the like present in a plasma. As dry etching, there is most widely used a reactive ion etching (RIE), according to which a sample is exposed to a high-frequency discharge plasma of a suitable gas, so that an etching reaction is generated on the sample surface to remove unnecessary parts thereof. Generally, the necessary parts or parts not to be removed of the sample surface, are to be protected by a photo-resist pattern serving as a mask.

For miniaturization, it is required to properly arrange ions in direction. In this connection, it is important to reduce ion scattering in the plasma. To properly arrange the ions in direction, it is effective to increase the degree of vacuum in a plasma generating apparatus to increase the average free stroke of the ions. However, when the degree of vacuum in the plasma chamber is increased, this presents the problem that discharge of high frequency hardly occurs.

In view of the foregoing, there has been developed a method of applying a magnetic field to a plasma chamber to facilitate discharge, e.g., a magnetron reactive ion etching technology, an electron cyclotron resonance etching technology (ECR), or the like.

FIG. 16 is a schematic diagram of a reactive ion etching apparatus using conventional magnetron discharge. Reactive gas is introduced into a metallic chamber 81 through a gas controller 82. The pressure in the chamber 81 is controlled to a suitable value by an exhaust system 83. An anode 84 is disposed at an upper part of the chamber 81, and a sample stage 85 serving as a cathode is disposed at a lower part of the chamber 81. An RF power supply 87 is connected to the sample stage 85 through an impedance matching circuit 86, so that high frequency discharge takes place between the sample stage 85 and the anode 84.

Disposed at the lateral sides of the chamber 81 are two pairs of AC electromagnets 88 of which phases are shifted by 90°, the AC electromagnets 88 of each pair being opposite to each other. By the two pairs of AC electromagnets 88, a rotational magnetic field is applied into the chamber 81 to facilitate discharge under a high vacuum. With such an arrangement, the rotational magnetic field causes electrons to present cycloid motions. This lengthens the motional passages of the electrons to increase the efficiency of ionization.

According to the magnetron technology or ECR technology above-mentioned, however, the plasma is non-uniform in density. This not only makes fine etching difficult, but also induces damages to a sample or workpiece.

In a conventional magnetron reactive ion etching apparatus, the rotational magnetic field averages the local ununiformity of a plasma with the passage of time, causing the plasma ununiformity to be equalized. However, since the momentary densities of plasma are not uniform, potentials locally differ from one another. Accordingly, when the conventional magnetron reactive ion etching apparatus is applied to a MOSLSI process, there is a possibility of a gate oxide layer being broken.

In an ECR etching apparatus, too, since the magnetic field is distributed in the radial direction of the chamber, the plasma densities are locally coarse and dense. This causes the etching source to be ununiform or produces local differences in potential. Due to the ununiformity of the plasma, the uniformity of etching is deteriorated, thus making it difficult to produce LSIs with high yield. When the plasma is not uniform, it means that accurate etching cannot be made when dry-etching large-diameter wafers or hyperfine pattern LSIs in which thinner gate oxide layers are used.

Also, there has been proposed a method by which high frequency electric power of 100 to 200 MHz is superposed on a conventional magnetron etching apparatus of the parallel flat-plate type to be excited with 13.56 MHz, causing the plasma to be increased in density so that the self-bias voltage is decreased to reduce damages to a sample by high-energy ions.

According to this method, the plasma density can be increased, but it is difficult to improve the uniformity of the plasma. Thus, the problems due to non-uniformity of the plasma in the above-mentioned method cannot be fully solved.

In view of the foregoing, the present invention is proposed with the object of generating a highly dense plasma excellent in uniformity under a high vacuum.

SUMMARY OF THE INVENTION

To achieve the object above-mentioned, a first plasma generating method according to the present invention comprises the steps of: disposing a pair of lateral electrodes opposite to each other through a plasma generating part in a vacuum chamber; supplying high frequency electric power from a high frequency power supply to one of the pair of lateral electrodes; and supplying, to the other of the pair of lateral electrodes, high frequency electric power which is supplied from the high frequency power supply through a delay circuit, of which frequency is the same as that of the first-mentioned high frequency electric power and of which phase is different from that of the first-mentioned high frequency electric power; whereby there is excited, in the plasma generating part, a high frequency electric field to cause electrons therein to present oscillating motions.

A first plasma generating apparatus according to the present invention comprises electric field exciting means for exciting, in a plasma generating part in a vacuum chamber, a high frequency electric field to cause electrons in the plasma generating part to present oscillating motions, the electric field exciting means comprising: a pair of lateral electrodes opposite to each other through the plasma generating part; a high frequency power supply for supplying high frequency electric power to one of the pair of lateral electrodes; and a delay circuit for supplying, with a delay, to the other of the pair of lateral electrodes, high frequency electric power which is received from the high frequency power supply, of which frequency is the same as that of the first-mentioned high frequency electric power and of which phase is different from that of the first-mentioned high frequency electric power.

According to each of the first plasma generating method and apparatus, the electrons in the plasma generating part advance as arranged in the direction of the kinetic energy inherent therein, while being subjected to oscillating motions by the high frequency electric field excited in the plasma generating part. Such motions of the electrons practically increase the cross section of collision between the electrons and gas molecules. This not only assures a higher efficiency of ionization even under a high vacuum but also facilitates electric discharge as compared with a conventional plasma generating apparatus of the parallel flat-plate type.

According to each of the first plasma generating method and apparatus, the high frequency electric field in the plasma generating part is more uniform than the distribution of a magnetic field excited according to each of conventional plasma generating method and apparatus. Thus, a plasma excellent in uniformity can be obtained.

Since the electric field exciting means has the delay circuit having the arrangement above-mentioned, there can be provided a simple circuit capable of supplying, to the pair of lateral electrodes, the high frequency electric powers which are supplied from the same high frequency power supply, of which frequencies are the same as each other and of which phases are different from each other. Even though the electric powers supplied to the pair of lateral electrodes become ill balanced for some reasons, such lack of balance of the input electric powers can be automatically corrected since the lateral electrodes are connected to each other through the delay circuit.

A second plasma generating method according to the present invention comprises the steps of: disposing three or more lateral electrodes at lateral sides of a plasma generating part in a vacuum chamber such that the three or more lateral electrodes surround the plasma generating part; supplying high frequency electric power from a high frequency power supply to one of the three or more lateral electrodes; and respectively supplying, to other lateral electrodes of the three or more lateral electrodes, high frequency electric powers which are supplied from the high frequency power supply through delay circuits, which have the same frequency identical with the frequency of the first-mentioned high frequency electric power and of which respective phases are successively different from the phase of the first-mentioned high frequency electric power; whereby there is excited, in the plasma generating part, a rotational electric field to cause electrons therein to present rotational motions.

A second plasma generating apparatus according to the present invention comprises electric field exciting means for exciting, in a plasma generating part in a vacuum chamber, a rotational electric field to cause electrons in the plasma generating part to present rotational motions, the electric field exciting means comprising: three or more lateral electrodes so disposed as to surround the plasma generating part; a high frequency power supply for supplying high frequency electric power to one of the three or more lateral electrodes; and a delay circuit group comprising a plurality of delay circuits for respectively supplying, with a delay, to other lateral electrodes of the three or more lateral electrodes, high frequency electric powers which are received from the high frequency power supply, which have the same frequency identical with the frequency of the first-mentioned high frequency electric power, and of which respective phases are successively different from the phase of the first-mentioned high frequency electric power.

According to each of the second plasma generating method and apparatus, the electrons in the plasma generating part advance as arranged in the direction of the kinetic energy inherent therein, while being subjected to rotational motions by the rotational electric field excited in the plasma generating part. Such motions of the electrons practically increase the cross-section of collision between the electrons and gas molecules. This not only assures a higher efficiency of ionization even under a high vacuum, but also facilitates electric discharge as compared with a conventional plasma generating apparatus of the parallel flat-plate type.

According to each of the second plasma generating method and apparatus, the rotational electric field in the plasma generating part is more uniform than the distribution of a magnetic field excited according to each of conventional plasma generating method and apparatus. Thus, a plasma excellent in uniformity can be obtained.

Since the electric field exciting means has the delay circuit group having the arrangement above-mentioned, there can be provided a simple circuit capable of respectively supplying, to the three or more lateral electrodes, the high frequency electric powers which are supplied from the same high frequency power supply, of which frequencies are the same as each other and of which phases are different from each other. Even though the electric powers supplied to the three or more lateral electrodes become ill balanced for some reasons, such lack of balance of the input electric powers can be automatically corrected since the lateral electrodes are connected to one another through the delay circuits.

According to each of the first and second plasma generating apparatus, the lateral wall of the vacuum chamber may be made of a dielectric, and the pair of lateral electrodes or the three or more lateral electrodes may be disposed outside of the vacuum chamber.

According to each of the first and second plasma generating apparatus, each delay circuit may be formed by a low-pass filter.

According to the second plasma generating apparatus, the delay times by which the high frequency electric powers are successively delayed by the delay circuits forming the delay circuit group, are preferably substantially equal to one another.

Preferably, the second plasma generating apparatus further comprises magnetic field applying means for applying, to the plasma generating part, a magnetic field to give, to the electrons in the plasma generating part, revolving motions in a direction identical with or reverse to the direction of the rotational motions of the electrons caused by the rotational electric field excited by the electric field exciting means. With such an arrangement, the rotational electric field causes the electrons in the plasma generating part to present translational cycloid motions in which the centers of the rotational motions advance, and the magnetic field converts the translational motion components of the electrons which present the translational cycloid motions, into revolving motion components which revolve in the plasma generating part. More specifically, the electrons in the plasma generating part are moved such that the centers of the rotational motions generated by the rotational electric field, travel on the loci of the revolving motions generated by the magnetic field. Accordingly, the electrons do not come out from the plasma generating part and present cycloid motions together with rotational motions.

A third plasma generating apparatus according to the present invention comprises: a sample stage disposed at a lower part of a plasma generating part in a vacuum chamber; electric field exciting means for exciting, in the plasma generating part, a rotational electric field to cause electrons in the plasma generating part to present rotational motions, the electric field exciting means comprising (i) three or more lateral electrodes so disposed as to surround the plasma generating part and (ii) first high frequency electric power supplying means for respectively supplying, to the three or more lateral electrodes, high frequency electric powers which have the same frequency and of which respective phases are successively different from one another; and second high frequency electric power supplying means for supplying, to the sample stage, high frequency electric power having frequency which is different from the first-mentioned frequency of the high frequency electric powers supplied from the first high frequency electric power supplying means, through a filter circuit which presents high impedance characteristics to the first-mentioned frequency of the high frequency electric powers supplied from the first high frequency electric power supplying means.

As with the second plasma generating apparatus, the third plasma generating apparatus is arranged such that electrons in the plasma generating part advance as arranged in the direction of the kinetic energy inherent therein, while being subjected to rotational motions by the rotational electric field. This not only assures a high efficiency of ionization even under a high vacuum, but also facilitates electric discharge. Further, since the rotational electric field in the plasma generating part is uniform, there can be obtained a plasma excellent in uniformity.

According to the third plasma generating apparatus, the first high frequency electric power supplying means is preferably adapted to supply the high frequency electric powers to the three or more lateral electrodes through a filter circuit presenting high impedance characteristics to the frequency of the high frequency electric power supplied from the second high frequency electric power supplying means.

Such an arrangement causes the high frequency electric power supplied to the sample stage to be independent from the high frequency electric powers which are supplied to the lateral electrodes and which mainly contribute to the generation of a plasma.

According to the third plasma generating apparatus, the frequency of the high frequency electric powers supplied from the first high frequency electric power supplying means is preferably higher than the frequency of the high frequency electric power supplied from the second high frequency electric power supplying means.

Preferably, the third plasma generating apparatus also comprises magnetic field applying means for applying, to the plasma generating part, a magnetic field to give, to the electrons in the plasma generating part, revolving motions in a direction identical with or reverse to the direction of the rotational motions of the electrons caused by the rotational electric field excited by the electric field exciting means.

DESCRIPTION OF THE DRAWINGS

FIG. 7 is a characteristic view showing the relationship between the frequency of high frequency electric powers applied to lateral electrodes of the dry etching apparatus in FIG. 1 and the distance that an electron moves during one cycle of the high frequency electric powers above-mentioned;

FIG. 12 is a table in which the dry etching apparatus in FIG. 1 is compared with conventional dry etching apparatus;

FIG. 13 is a characteristic view showing the relationship between frequency and sheath voltage and the relationship between frequency and the light emitting intensities of ions and radicals, in a plasma of halogen gas generated by the plasma generating method according to a second embodiment of the present invention;

DETAILED DESCRIPTION OF THE INVENTION

The following description will discuss a dry etching apparatus to which applied is the plasma generating method according to a first embodiment of the present invention.

Figure 1:
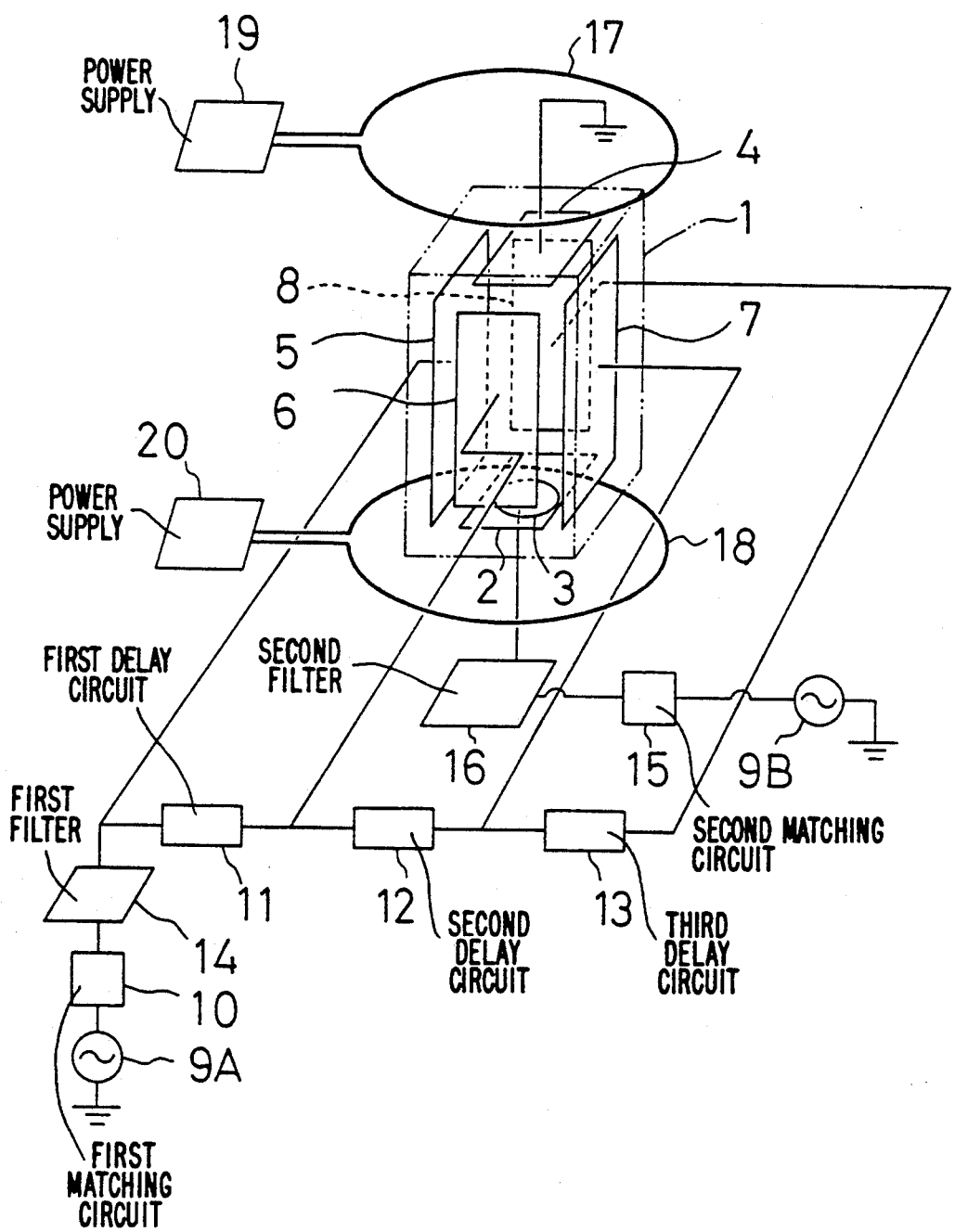
FIG. 1 is a schematic diagram showing the structure of a dry etching apparatus to which applied is a plasma generating method according to a first embodiment of the present invention.

FIG. 1 is a schematic diagram of the structure of the dry etching apparatus. In FIG. 1, a sample stage 2 is disposed at a lower part of a rectangular parallelepiped chamber 1 (vacuum chamber). A sample to be etched 3 comprising a semiconductor wafer is placed on the sample stage 2. An opposite electrode 4 is disposed at an upper part of the chamber 1 and opposite to the sample stage 2. First, second, third and fourth lateral electrodes 5, 6, 7, 8 comprising parallel flat-plate electrodes are respectively disposed at the lateral sides of the chamber 1. The space defined by the sample stage 2, the opposite electrode 4 and the first to fourth lateral electrodes 5, 6, 7, 8 is a plasma generating zone.

A first high frequency power supply 9A is adapted to supply high frequency electric powers having frequency of 10 MHz to the first to fourth lateral electrodes 5, 6, 7, 8 through a first matching circuit 10. Interposed between the first to fourth lateral electrodes 5 to 8 and the first matching circuit 10 is a first filter 14 which presents high impedance to high frequency electric power (having frequency of 1 MHz in this embodiment) to be applied to the sample stage 2.

A second high frequency power supply 9B is adapted to supply the high frequency electric power having frequency of 1 MHz to the sample stage 2 through a second matching circuit 15. Interposed between the sample stage 2 and the second matching circuit 15 is a second filter 16 which presents high impedance to the high frequency electric powers (having frequency of 10 MHz in this embodiment).

A first delay circuit 11 is disposed between the first lateral electrode 5 and the second lateral electrode 6. The first delay circuit 11 causes the high frequency electric power applied to the second lateral electrode 6 to present a difference in phase of about 90° from the high frequency electric power applied to the first lateral electrode 5. A second delay circuit 12 is disposed between the second lateral electrode 6 and the third lateral electrode 7. The second delay circuit 12 causes the high frequency electric power applied to the third lateral electrode 7 to present a difference in phase of about 90° from the high frequency electric power applied to the second lateral electrode 6. A third delay circuit 13 is disposed between the third lateral electrode 7 and the fourth lateral electrode 8. The third delay circuit 13 causes the high frequency electric power applied to the fourth lateral electrode 8 to present a difference in phase of about 90° from the high frequency electric power applied to the third lateral electrode 7.

Figure 2:
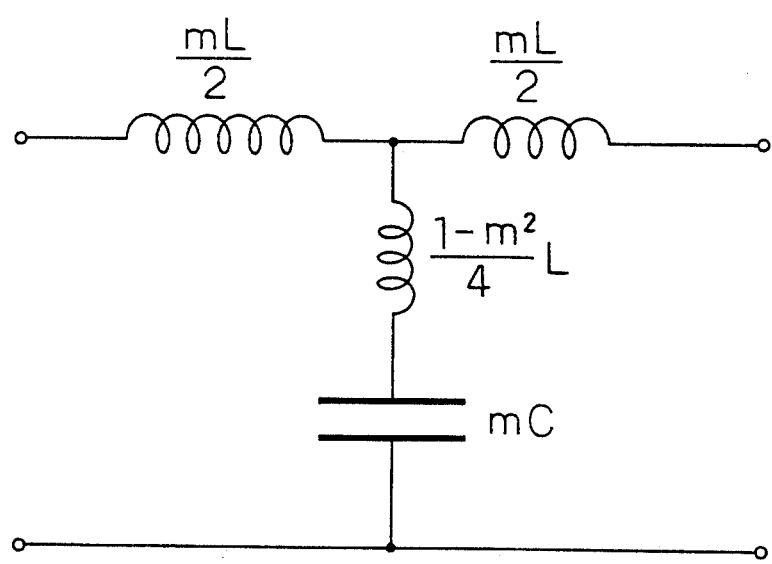
FIG. 2 is a circuit diagram of a delay circuit in the dry etching apparatus shown in FIG. 1.

Each of the first to third delay circuits 11, 12, 13 is a so-called m-type low-pass filter as shown in FIG. 2. Generally, about 1.27 is selected as the value of m. Delay time Td provided for each of the first to third delay circuits 11, 12, 13 is expressed by the following equation:

$$Td = (LC)^{\frac{1}{2}}$$

Returning to FIG. 1, etching gas is introduced from an inlet port (not shown) into the chamber 1 through a mass flow controller (not shown), and the pressure in the chamber 1 is controlled to about 0.1 Pa to about 10 Pa by a turbo pump (not shown).

An upper circular coil 17 and a lower circular coil 18 are respectively disposed at upper and lower parts of the chamber 1. Power supplies 19, 20 which are direct current power supplies or pulse power supplies, are adapted to supply electric currents to the upper and lower circular coils 17, 18. Accordingly, applied to the inside of the chamber 1 is a magnetic field substantially at a right angle to the sample stage 2.

Figure 3:
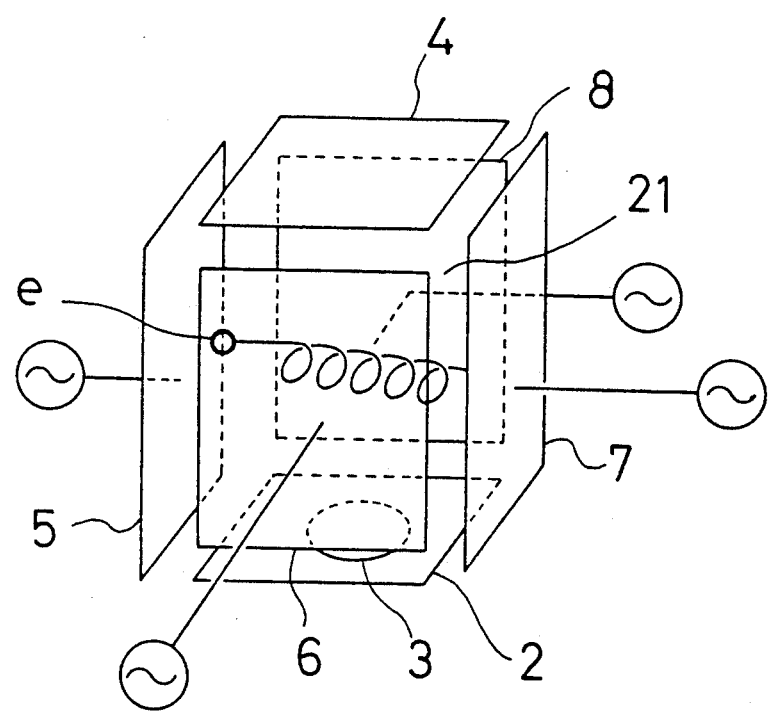
FIG. 3 is a schematic diagram showing the locus of a motional passage of an electron in a chamber of the dry etching apparatus shown in FIG. 1.

With reference to FIG. 3, the following description will discuss the operation of the dry etching apparatus having the arrangement above-mentioned.

FIG. 3 schematically shows the trajectory of each of electrons e moved at the time when high frequency electric powers are applied to the first to fourth lateral electrodes 5 to 8 surrounding the plasma generating part 21. While being subjected to rotational motions by the rotational electric field applied to the plasma generating part 21, the electrons e advance in the direction of the kinetic energy inherent therein.

Although not shown, only the first lateral electrode 5 and the third lateral electrode 7 may be disposed through the plasma generating part 21, or only the second lateral electrode 6 and the fourth lateral electrode 8 may be disposed through the plasma generating part 21, and there may be applied, to such a pair of opposite lateral electrodes, high frequency electric powers which are supplied from the same high frequency power supply, which have the same frequency, and of which phases are made different by 180° from each other by using a delay circuit. In such an arrangement, the electrons in the plasma generating part 21 advance as arranged in the direction of the kinetic energy inherent therein, while being subjected to oscillating motions by a high frequency electric field applied to the plasma generating part 21.

FIG. 7 is a graph showing, in terms of the function of frequency, the distance that an electron e advances during one cycle of the high frequency electric powers. Here, an electron of 20 eV is considered. An electron e which travels in the X direction at an energy of 20 eV, moves about 6 cm during 20 nanoseconds which corresponds to one cycle of the high frequency electric powers of 50 MHz. When it is now supposed that the distance between the opposite lateral electrodes is equal to 30 cm, the electron e oscillates about five times while it travels this distance of 30 cm. When the energy of the electron e is great, the travelling speed is great to reduce the number of oscillations while the electron e travels the distance between the opposite lateral electrodes.

To ionize gas, an electron energy of not smaller than about 15 eV is generally required although it depends on the kind of gas. Ionization takes place due to collision between the electrons e and gas molecules. Accordingly, as the travelling distances of the electrons e are longer, the probability of collision is increased, thereby increasing the efficiency of ionization. In this connection, the present invention is so arranged as to cause the electrons to present rotational motions or oscillating motions to lengthen the travelling distances of the electrons. This increases the efficiency of ionization. Further, it can be considered that the rotational motions or oscillating motions of electrons practically increase the cross section of collision between the electrons and gas molecules.

To rotate or oscillate the electrons e by the high frequency electric powers to improve the efficiency of ionization, high frequency of not less than about 50 MHz is required since the distance between the opposite lateral electrodes is generally douzen cm. However, even though high frequency electric powers of less than 50 MHz is applied to reduce the travelling distances of the electrons e, the electrons of which energies are low are still rotated or oscillated to lower the probability of the electrons coming in collision with the chamber wall, causing the electrons to disappear. This prevents the electrons from being lowered in density, thus enhancing the efficiency of ionization.

Further, as will be discussed, when a magnetic field is applied to the inside of the chamber 1, the magnetic field causes electrons to present revolving motions, in addition to the rotational motions or oscillating motions by the electric field. Accordingly, a high efficiency of ionization can be achieved even with high frequency lower than 50 MHz.

Figure 4:
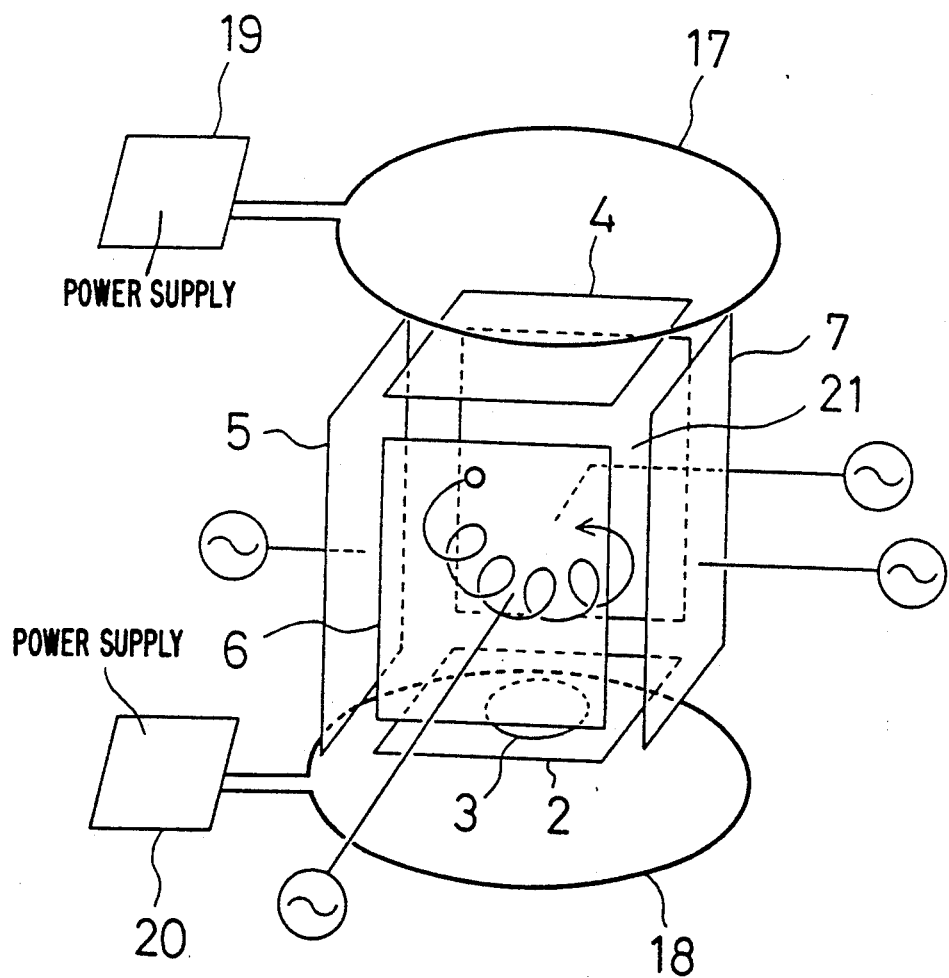
FIG. 4 is a schematic diagram showing the locus of a motional passage of an electron in the chamber of the dry etching apparatus shown in FIG. 1.
Figure 5A:
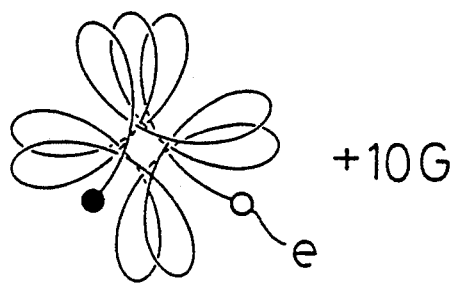
FIGS. 5A-5C are schematic diagrams showing the locus, as projected on a horizontal plane, of a motional passage of an electron in the chamber of the dry etching apparatus shown in FIG. 1.
Figure 5B:
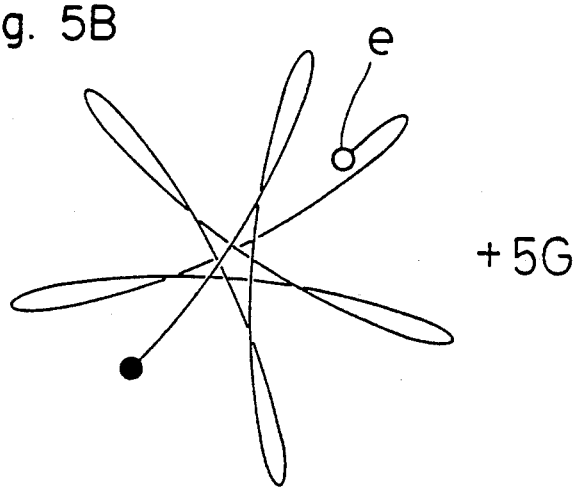
Figure 5C:
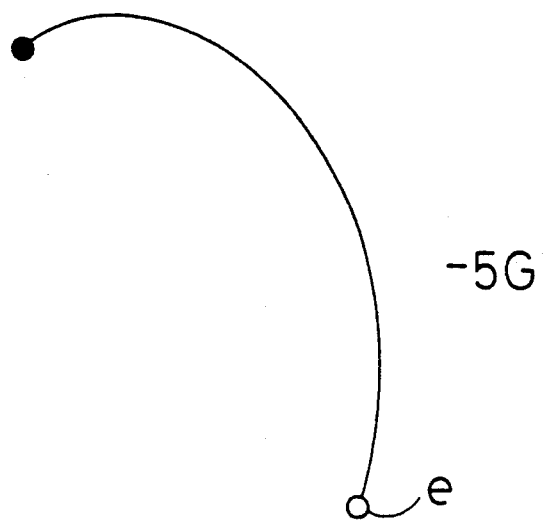
Figure 6A:
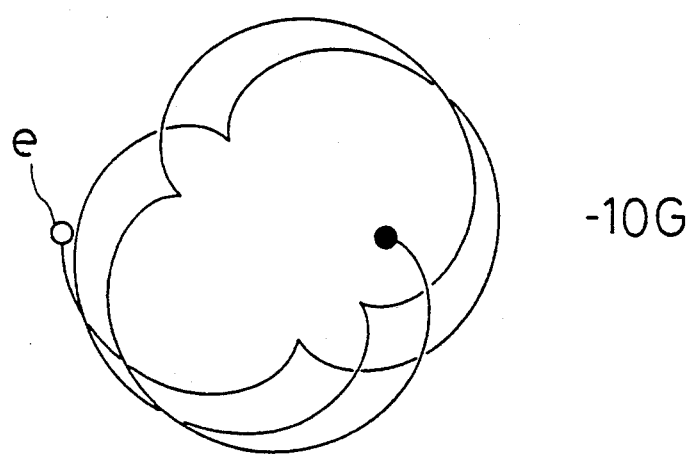
FIGS. 6A-6B are schematic diagrams showing the locus, as projected on a horizontal plane, of a motional passage of an electron in the chamber of the dry etching apparatus shown in FIG. 1.
Figure 6B:
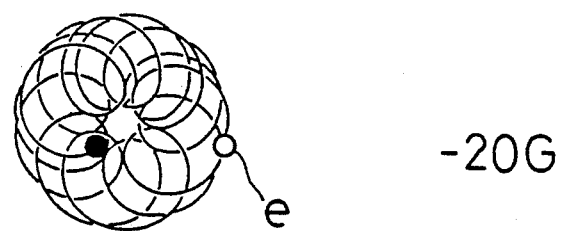

FIG. 4 shows the motional passage of each of electrons e moved at the time when a direct current is supplied to the upper and lower circular coils 17, 18 so that a magnetic field substantially at a right angle to the sample stage 2 is applied to the rotational electric field shown in FIG. 3. In such an arrangement, the translational motion of each of the electrons e travelling toward a lateral wall of the chamber 1 in the state shown in FIG. 3, is converted into a motion by which each of the electrons e revolves in the plasma generating part 21. The magnitude of such a revolving motion is proportional to the product of the magnitude of the electric field applied and the magnitude of the magnetic field applied. The direction of the revolving motion is at a right angle to both the electric and magnetic fields applied. As a result, each of the electrons e presents a motion in which a cyclotron revolving motion caused by the magnetic field is superposed on the rotational motion caused by the rotational electric field generated by the high frequency electric powers.

FIGS. 5A–5C and 6A–6B show how the motional passage of each of the electrons e is changed when the magnetic field is applied to each of the electrons e in the state shown in FIG. 3 while changing the intensity of the magnetic field. Thus, when the electric field and the magnetic field are applied to the plasma generating part 21 to cause the electrons in the plasma generating part 21 to present revolving motions together with the rotational motions and oscillating motions, most of the electrons e in the plasma generating part 21 can be confined therein and the travelling distances of the electrons e can be lengthened. This increases the density of the electrons e in the plasma generating part 21, thus increasing the efficiency of ionization.

Figure 8A:
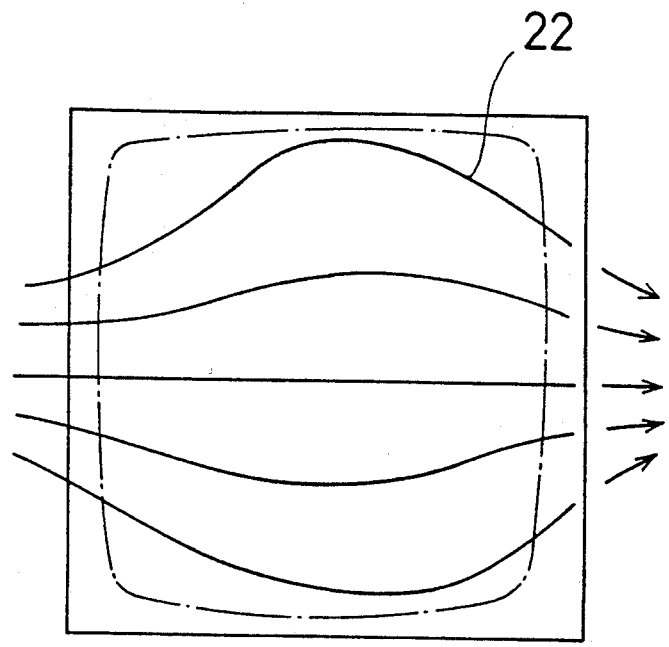
FIG. 8 (a) and (b) are schematic diagrams respectively showing a magnetic flux distribution and the rotations of electrons in a conventional magnetron etching apparatus.
Figure 8B:
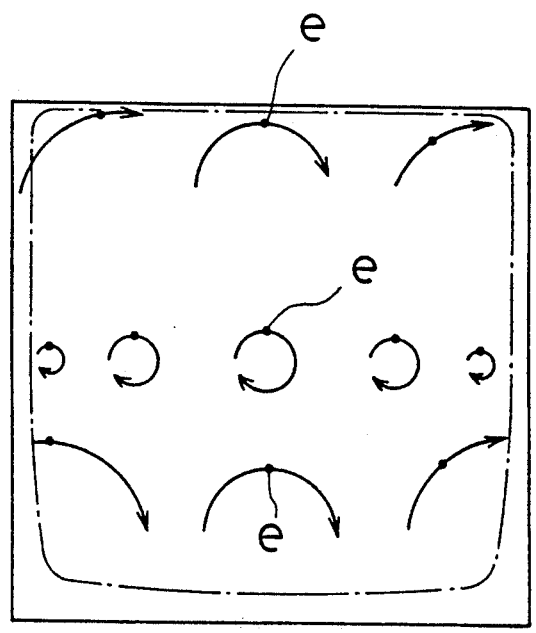

With a magnetron etching apparatus using a conventional rotational magnetic field, the distribution of magnetic flux 22 immediately above the sample stage 2 at a certain moment is not uniform as shown in FIG. 8 (a). Each of electrons e (represented by black points in FIG. 8 (b)) in the chamber 1 is rotated with an orbital radius which is in inverse proportion to the intensity of the magnetic field. Accordingly, at the upper and lower parts of the chamber 1 and the outer peripheral part of the plasma generating zone where the intensity of the magnetic field is weak, each electron e is increased in orbital radius, so that the electron e comes in collision with the wall of the chamber 1, causing the electron e to disappear.

Consideration is now given to the direction which traverses the center part of the plasma generating part 21 from the left side to the right side. At the center part where the intensity of the magnetic field is weak, the electrons e are decreased in density to decrease the plasma in density. At the outer peripheral part where the intensity of the magnetic field is strong, the electrons e are increased in density to increase the plasma in density. In such a conventional dry etching apparatus, the entire plasma density is thus not uniform. This causes a workpiece to be unevenly etched or damaged.

Figure 9:
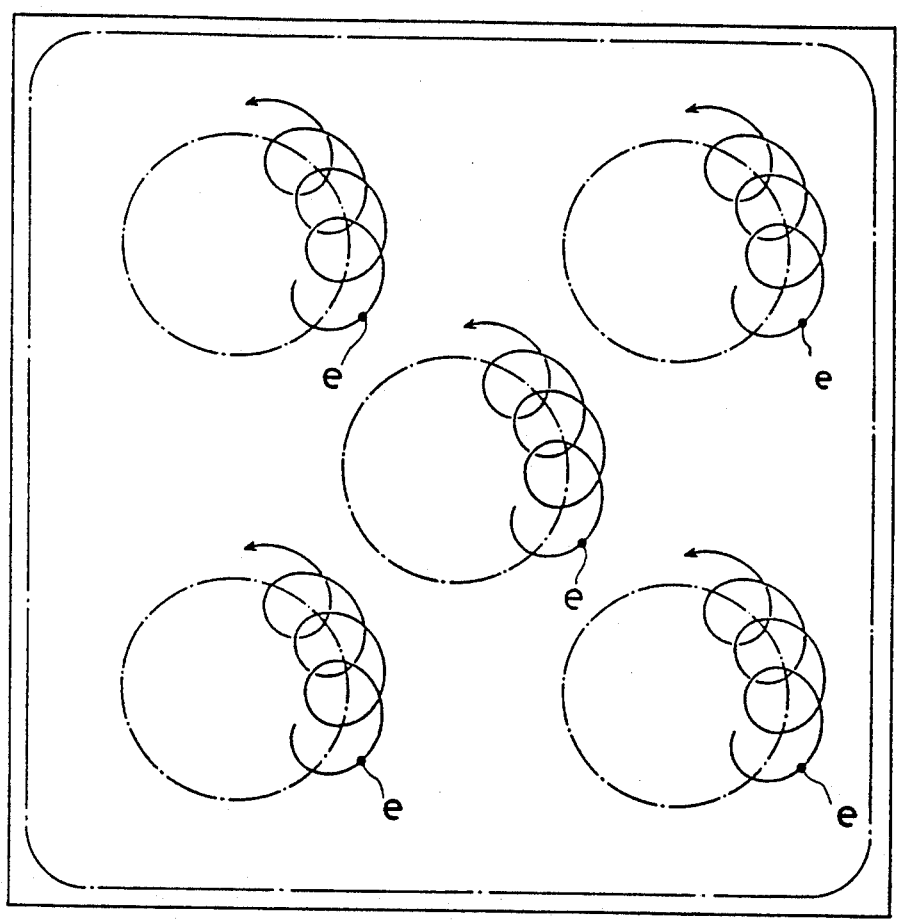
FIG. 9 is a schematic diagram showing the rotations of electrons in the the dry etching apparatus shown in FIG. 1.

On the other hand, in the dry etching apparatus to which the plasma generating method of the present invention is applied, the electric field and the magnetic field in the plasma generating part 21 surrounded by the first to fourth lateral electrodes 5, 6, 7, 8 are substantially uniform. Accordingly, as shown in FIG. 9, the configurations of the loci of cycloid motion combined with rotational motion of electrons e are substantially equal to one another at different places. Accordingly, the plasma density is substantially uniform in the plasma generating part 21 in its entirety. In this dry etching apparatus, reactive radicals and ions produced from etching reactive gas in the plasma generating part 21 are irradiated substantially uniformly on the entire surface of the sample to be etched 3. Accordingly, etching can be uniformly conducted on the entire area of the sample to be etched 3 exposed to the plasma generating part 21, damages to the sample due to charge-build-up are considerably reduced and the plasma density is high, thereby increasing the etching rate.

Figure 10A:
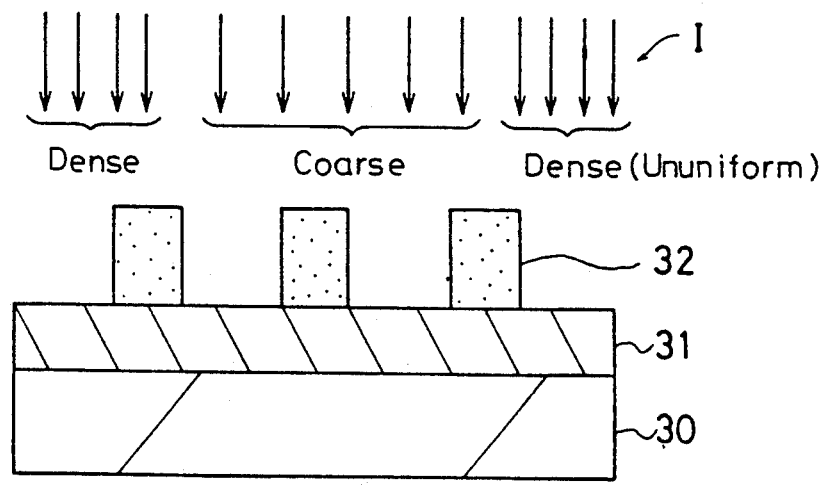
FIG. 10 (a) to (c) are views illustrating how boron phosphorus glass is etched with the use of a conventional magnetron etching apparatus, wherein (a) is a section view of the glass under etching, (b) is a view illustrating the intensity distribution of a magnetic field, and (c) is a view illustrating the etching speed.
Figure 10B:
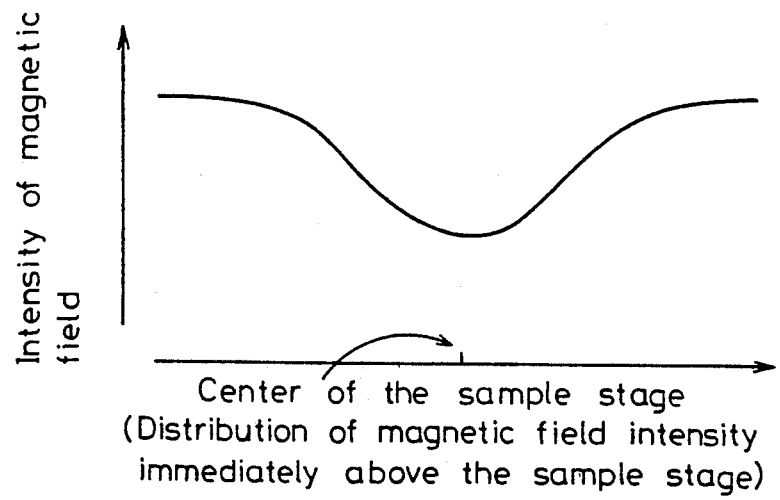
Figure 10C:
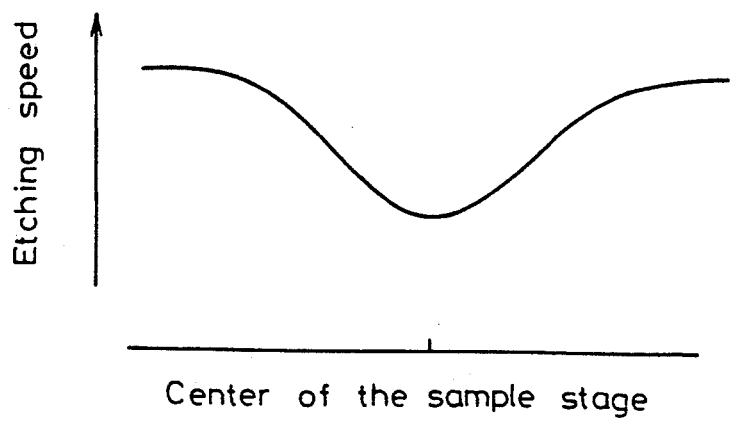

FIG. 10 (a) schematically shows an example of etching boron phosphorus glass with a magnetron etching apparatus using a conventional rotational magnetic field. In FIG. 10 (a), there are shown a Si substrate 30, boron phosphorus glass 31 and a photo-resist pattern 32. When the distribution of the intensities of a magnetic field at a certain moment immediately above the Si substrate 30 or sample stage is minimized at the center of the sample stage as shown in FIG. 10 (b), an ion flux I incident upon the surface of the Si substrate 30 is proportional to the plasma density distribution corresponding to the magnetic field intensity distribution and is therefore coarse at the center as shown in FIG. 10 (a). As shown in FIG. 10 (c), the etch rate of an oxide layer (boron phosphorus glass 31) substantially follows the ion flux I and is therefore not uniform. Further, the non-uniformity of the plasma density causes the devices on the Si substrate 30 to be damaged due to uneven distribution of electric charges.

Figure 11A:
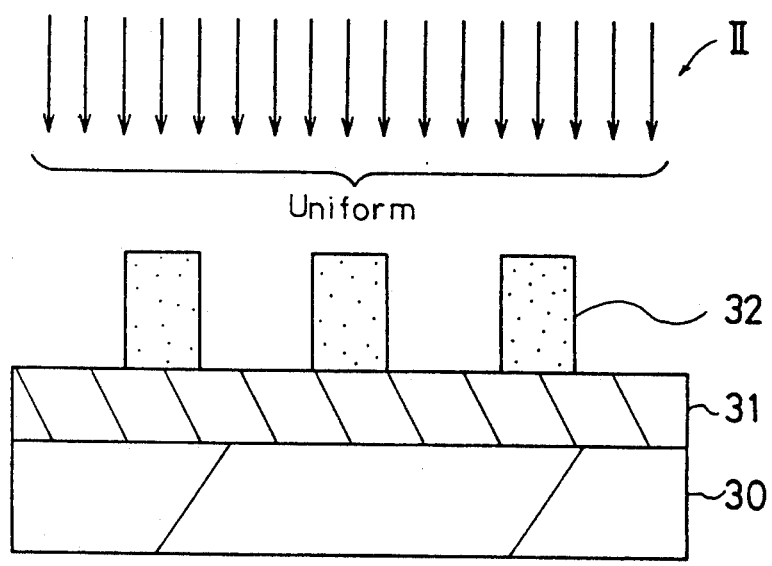
FIG. 11 (a) and (b) are views illustrating how boron phosphorus glass is etched with the use of the dry etching apparatus shown in FIG. 1, wherein (a) is a section view of the glass under etching, and (b) is a view illustrating the etching speed.
Figure 11B:
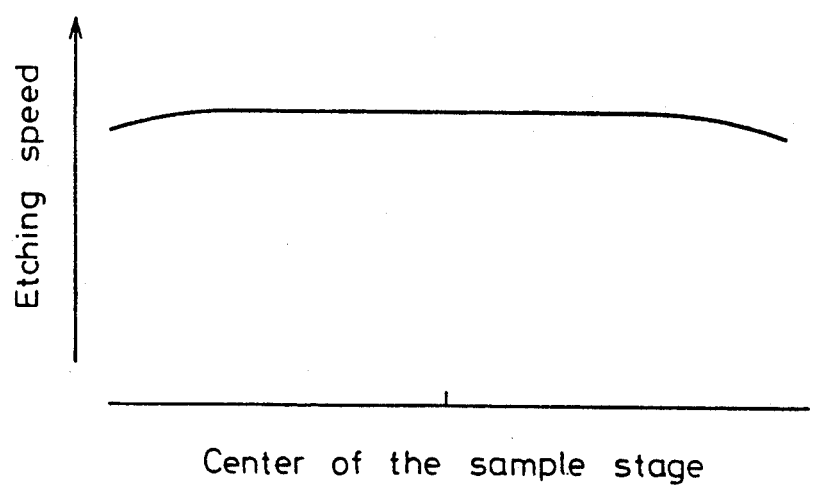

FIG. 11 (a) schematically shows an example of etching boron phosphorus glass with a dry etching apparatus to which the plasma generating method of the present invention is applied. With this dry etching apparatus, a substantially uniform plasma is generated as mentioned earlier. Accordingly, an ion flux II or etching reaction product incident upon the surface of the Si substrate 30 is uniform as shown in FIG. 11 (a). Further, the etch rate is also highly uniform as shown in FIG. 11 (b). Further, since the plasma is uniform, electric charges are hardly unevenly distributed so that damages to the devices due to the charge-build-up are considerably small. In this example, as the gas to be introduced into the chamber 1, there was used gas made based on fluorocarbon gas such as $CHF_3+O_2$, $CF_4+CH_2F_2$ or the like, and the gas pressure was set to 0.1 to 10 Pa. The etching rate was in the range from 100 to 350 nm/min.

Such a dry etching apparatus may be suitably used particularly for etching a sub-micron pattern or a large-diameter semiconductor wafer of 6", 8" or the like. More specifically, since the pressure in the chamber 1 is low, ion scattering is reduced. This lowers the dependency, on the pattern size, of the etching rate or the dimensional shift (so-called CD loss) which is calculated by subtracting the line width of the pattern after etched, from the line width of the photoresist pattern. Further, since the uniformity of the plasma is high, the chamber 1 can be readily increased in size.

As discussed in the foregoing, in the present embodiment, the first filter 14 (FIG. 1) presenting high impedance to the frequency of the high frequency electric power supplied to the sample stage 2 is inserted in the circuit adapted to supply the high frequency electric powers to the first to fourth lateral electrodes 5 to 8 which control the plasma density and which generate the rotational electric field. On the other hand, the second filter 16 presenting high impedance to the frequency of the high frequency electric powers supplied to the first to fourth lateral electrodes 5 to 8 is inserted in the circuit for supplying the high frequency electric power to the sample stage 2. Accordingly, the circuit for supplying the high frequency electric powers to the first to fourth lateral electrodes 5 to 8 is independent from the circuit for supplying the high frequency electric power to the sample stage 2, thus generating a stable and uniform plasma.

In FIG. 12, the dry etching method of this embodiment is compared with conventional dry etching methods. From FIG. 12, it can be understood that the dry etching method of the present embodiment is superior to the conventional methods.

According to the present embodiment discussed in the foregoing, there are applied, to the first to fourth lateral electrode 5 to 8 surrounding the plasma generating part 21, the high frequency electric powers of which frequencies are the same as one another and of which phases are respectively different by 90° from one another, so that the electrons e in the plasma generating part 21 under a vacuum present rotational motions, thus generating a highly dense plasma excellent in uniformity inspire of a high vacuum.

By controlling the high frequency electric power supplied to the sample stage 2, etch selectivity to the substrate can be controlled. Further, the plasma is hardly unevenly distributed, thus considerably reducing damages to workpieces.

The present embodiment is arranged such that each of the differences in phase among the high frequency electric powers is set to 90 °. This is because, when each of the differences in phase is set to 90°, the efficiency of supplying the electric powers to the plasma is good. However, even if each of the differences in phase is set to other than 90°, the effects produced by the present invention could be also obtained. Further, the phases of the high frequency electric powers applied to the first to fourth lateral electrodes 5 to 8 can be changed in terms of function of time.

The following description will discuss the plasma generating method according to a second embodiment of the present invention.

In the first embodiment, the frequency of the high frequency electric powers supplied to the first to fourth lateral electrodes 5 to 8 which mainly contribute to the generation of a plasma, is equal to 10 MHz which is higher than the frequency of 1 MHz of the high frequency electric power applied, as a bias potential, to the sample stage 2. This is because it is a silicon oxide layer that is to be etched, and a relatively high ion energy is required for etching. In the second embodiment, the second frequency of the high frequency electric power applied, as a bias potential, to the sample stage 2 is higher than the first frequency of the high frequency electric powers which contribute to the generation of a plasma.

FIG. 13 shows the relationship between frequency (MHz) and sheath voltage (V) corresponding to the ion energy, and the relationship between frequency (MHz) and light emitting intensity in proportion to ion density or radical density, in a plasma of halogen gas. When the frequency is not less than 1 MHz, the ions cannot follow the AC electric field of a bias potential and the sheath voltage is low. When the frequency is greater than 1 MHz, the decomposition of the gas increases, resulting in increases in the radical density. From the foregoing, it is understood that, when desired to obtain a high selectivity to the substrate, the use of high frequency is desired in order to lower the ion energy.

When applying the plasma generating method of the present invention to dry-etching of polycrystal Si doped with phosphorus, the frequency of the high frequency electric power supplied, as a bias potential, to the sample stage 2 is set to 13 MHz, and the frequency of the high frequency electric powers supplied to the first to fourth lateral electrodes 5 to 8 for generation of a plasma, is set to 50 MHz, and a mixture containing chlorine and a trace amount of oxygen is used as gas to be introduced.

From test results, it is found that the present invention produces a greater effect when there is used, as the etching gas, electronegative gas such as $SF_6$, oxygen, chlorine, iodine or the like. This would be explained in the following manner. In a plasma of electronegative gas, the electron density is low and the resistance is high so that the potential gradient in the plasma is greater as compared with the case using electropositive gas.

In this case, too, the electric field inside of the first to fourth lateral electrodes 5 to 8 is uniform, so that a plasma excellent in uniformity is obtained and the uniformity of etching is also excellent. Since the plasma is hardly unevenly distributed, there are hardly observed damages to devices such as breakdown of MOSLSI gate oxide layers or the like. The etching rate obtained is in the range from 200 to 400 nm/min.

The second embodiment has shown dry-etching of polycrystal silicon. However, satisfactory effects can also be produced when the dry etching apparatus to which the plasma generating method of the present invention is applied, is used for etching a Si compound, metal such as Al or the like, or a multilayer resist.

Figure 14:
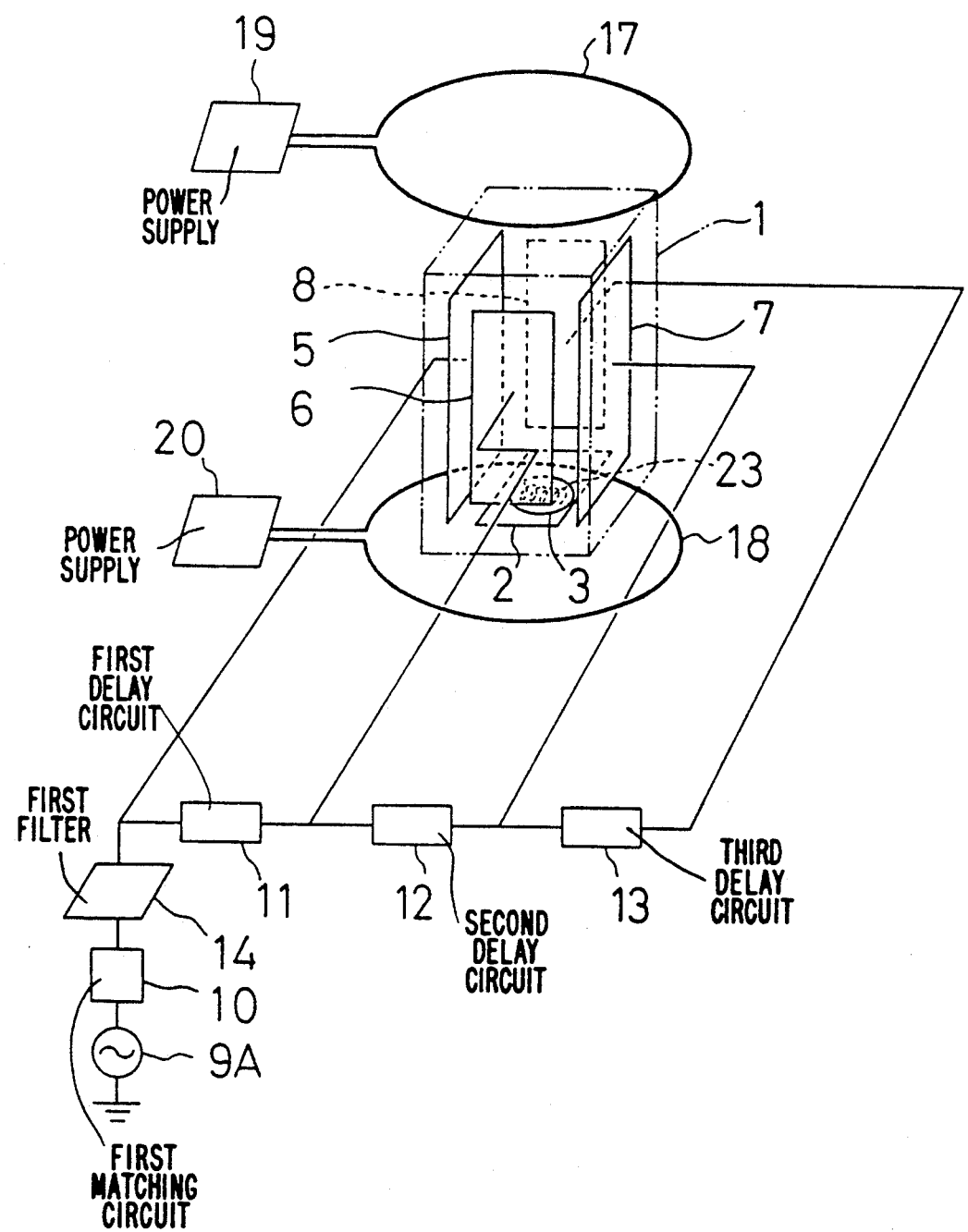
FIG. 14 is a schematic diagram showing the structure of a CVD apparatus to which applied is the plasma generating method according to a third embodiment of the present invention.

With reference to FIG. 14, the following description will discuss a CVD apparatus to which applied is the plasma generating method according to a third embodiment of the present invention.

The CVD apparatus to which the third embodiment is applied, differs in the following two points from the dry etching apparatus in FIG. 1 to which the first embodiment is applied. That is, the CVD apparatus in FIG. 14 does not have means for supplying the high frequency electric power to the sample stage 2 such as the second high frequency power supply 9B, the second matching circuit 15, the second filter 16 and the opposite electrode 4 shown in FIG. 1, and the CVD apparatus in FIG. 14 is provided on the sample stage 2 with a heater 23 for controlling the thickness of a deposit film. Other arrangements than the two points above-mentioned are the same as those of the dry etching apparatus shown in FIG. 1. Accordingly, like parts are designated by like reference numerals used in FIG. 1 with a detailed description thereof here omitted.

In the CVD apparatus, 15 sccm of $N_2$ gas and 15 sccm of $SiH_4$ gas are introduced into the chamber 1. Preferably, the pressures of these gases are set to 0.07 Pa and the temperature of the sample stage 2 is set to 400° C.

Figure 15:
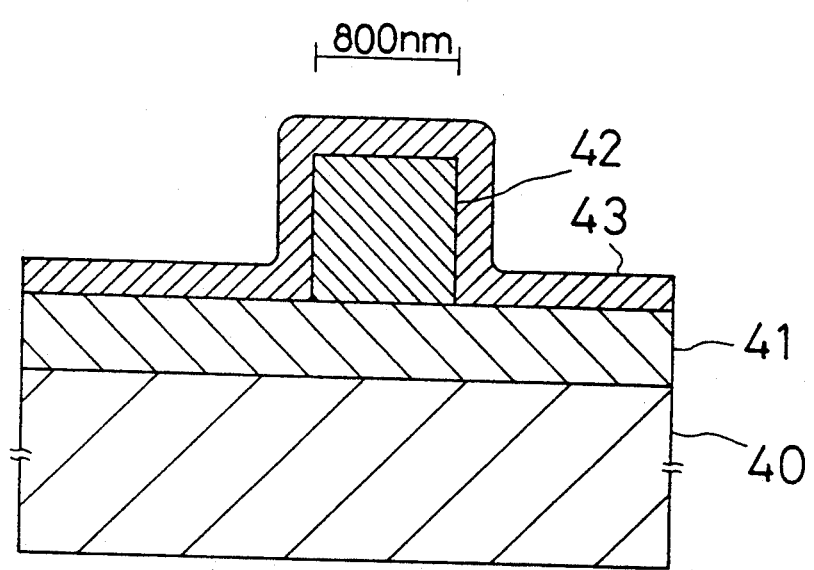
FIG. 15 is a section view of a semiconductor chip prepared by the CVD apparatus in FIG. 14.
Figure 16:
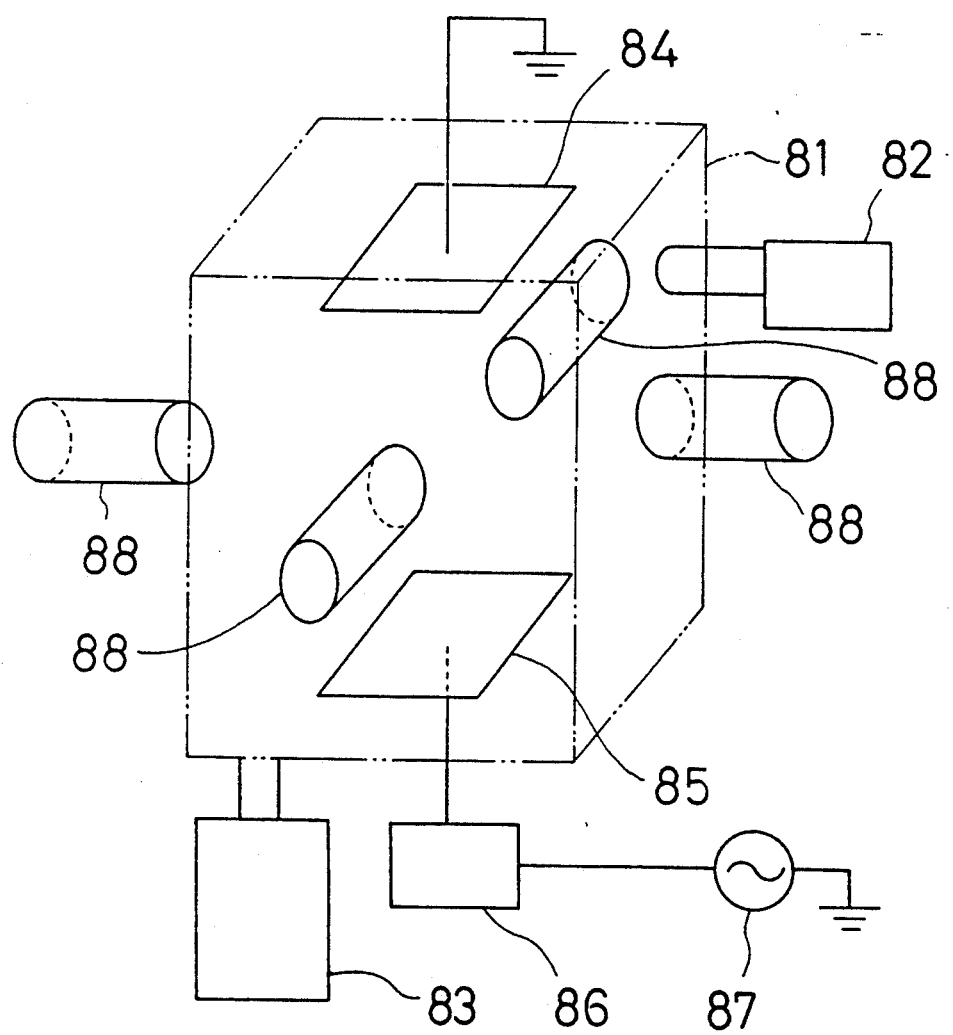
FIG. 16 is a schematic diagram of a reactive ion etching apparatus using conventional magnetron discharge.

FIG. 15 shows a section of a semiconductor chip prepared by the CVD apparatus. An oxide layer 41 is formed on a Si substrate 40. Aluminum 42 deposited in a thickness of 0.8 μm by sputtering, is made in the form of a line having a width of 0.8 μm by photolithography and dry etching. On the aluminum 42, a SiN layer 43 is deposited by the CVD apparatus.

This CVD apparatus is suitably used in a CVD method for a 6" or 8" large-diameter semiconductor wafer. That is, as discussed in connection with the dry etching apparatus, the CVD apparatus can enhance the spatial uniformity of a plasma so that a deposit layer can be uniformly formed on the wafer in its entirety.

What is claimed is:

1. A plasma generating method comprising the steps of:
   disposing three or more lateral electrodes at lateral sides of a plasma generating part in a vacuum chamber such that said three or more lateral electrodes surround said plasma generating part, and further disposing a sample stage at a lower part of said plasma generating part;
   supplying a first high frequency electric power from a high frequency power supply to one of said three or more lateral electrodes;
   respectively supplying, to other lateral electrodes of said three or more lateral electrodes, high frequency electric powers which are supplied from said high frequency power supply through delay means, of which frequencies are the same as the frequency of said first-mentioned high frequency electric power and of which respective phases are successively different from the phase of said first-mentioned high frequency electric power; and
   supplying, to said sample stage, second high frequency electric power of a second frequency which is lower than said first frequency;
   whereby there is excited, in said plasma generating part, a rotational electric field to cause electrons therein to present rotational motions.

2. The plasma generating method of claim 1 wherein said delay means comprises a delay circuit group.

3. A plasma generating apparatus comprising electric field exciting means for exciting, in a plasma generating part in a vacuum chamber, a rotational electric field to cause electrons in said plasma generating part to present rotational motions, said electric field exciting means comprising:
   three or more lateral electrodes so disposed as to surround said plasma generating part;
   a high frequency power supply for supplying a first high frequency electric power to one of said three or more lateral electrodes;
   a sample stage at a lower part of said plasma generating part, said sample stage being supplied with a second high frequency electric power which is lower in frequency than said first high frequency electric power; and
   a delay circuit group comprising a plurality of delay circuits for respectively supplying, with a delay, to other lateral electrodes of said three or more lateral electrodes, high frequency electric powers which are received from said high frequency electric power supply, which have the same frequency identical with the frequency of said first-mentioned high frequency electric power and of which respective phases are successively different from the phase of said first-mentioned high frequency electric power.

4. A plasma generating apparatus according to claim 3, wherein the lateral wall of the vacuum chamber is made of a dielectric, and the three or more lateral electrodes are disposed outside of said vacuum chamber.

5. A plasma generating apparatus according to claim 3, wherein the delay circuit group is arranged such that delay times by which the high frequency electric powers received from the high frequency power supply are successively delayed, are substantially equal to one another.

6. A plasma generating method comprising the steps of:
   disposing three or more lateral electrodes at lateral sides of a plasma generating part in a vacuum chamber, such that said three or more lateral electrodes surround said plasma generating part, and further disposing a sample stage at a lower part of said plasma generating part;
   respectively supplying, to said three or more lateral electrodes, first high frequency electric power of a first frequency, said first frequency having phases which are successively different from one another and wherein said phase differences are substantially equal to one another; and
   supplying, to said sample stage, second high frequency electric power of a second frequency which is different from said first frequency.

7. The plasma generating method according to claim 6 wherein said first frequency is higher than said second frequency.

8. The plasma generating method according to claim 7, wherein said first frequency is higher than 13.56 MHz.

9. A plasma generating apparatus, comprising:
   a sample stage disposed at a lower part of a plasma generating part in a vacuum chamber; and
   electric field exciting means for exciting, in said plasma generating part, a rotational electric field to cause electrons in said plasma generating part to present oscillating motions, said electric field exciting means comprising:
   three or more lateral electrodes surrounding said plasma generating part, and first high frequency power supply means for supplying, to each of said three or more lateral electrodes, first high frequency electric power of a first frequency, said first frequency having phases which are successively different from one another and wherein said phase differences are substantially equal to one another; and second high frequency power supply means for supplying, to said sample stage, second high frequency electric power of a second frequency which is different from said first frequency.

10. The plasma generating apparatus according to claim 9, wherein said first high frequency power supply means comprises:
   a high frequency power supply for supplying high frequency electric power to one of said three or more lateral electrodes; and
   delay means connected to said high frequency power supply for supplying, to the other lateral electrodes of said three or more lateral electrodes, high frequency electric power having phases which are successively different from the high frequency electric power received from said high frequency power supply, and wherein said phase differences are substantially equal to one another.

11. The plasma generating apparatus according to claim 10, wherein said delay means is a delay circuit group.

12. The plasma generating apparatus according to claim 9, wherein said first frequency is higher than said second frequency.

13. The plasma generating apparatus according to claim 9 wherein said first frequency is higher than 13.56 MHz.

14. The plasma generating apparatus according to claim 9, wherein a lateral wall of said vacuum chamber is made of a dielectric, and said three or more lateral electrodes are disposed outside of said vacuum chamber.

15. A plasma etching method comprising the steps of:
   disposing three or more lateral electrodes at lateral sides of a plasma generating part in a vacuum chamber, such that said three or more lateral electrodes surround said plasma generating part, and further disposing at a lower part of said plasma generating part a sample stage for receiving a substrate;
   respectively supplying, to said three or more lateral electrodes, first high frequency electric power of a first frequency, said first frequency having phases which are successively different from one another and wherein said phase differences are substantially equal to one another;
   supplying, to said sample stage, second high frequency electric power of a second frequency which is different from said first frequency; and
   etching a layer-to-be-etched of said substrate by introducing etching gas into said vacuum chamber.

16. The plasma etching method according to claim 15, wherein a pressure of said etching gas is set in a range between about 0.1 and 10 Pa.

17. The plasma etching method according to claim 15, wherein said layer-to-be-etched is an oxide layer, and said etching gas includes $CHF_3$ or $CF_4$.

18. The plasma etching method according to claim 15, wherein said layer-to-be-etched is a polysilicon layer, and said etching gas includes $Cl_2$ and $O_2$.

19. A plasma chemical vapor deposition method comprising the steps of:
   disposing three or more lateral electrodes at lateral sides of a plasma generating part in a vacuum chamber, such that said three or more lateral electrodes surround said plasma generating part, and further disposing a sample stage at a lower part of said plasma generating part;
   respectfully supplying, to said three or more lateral electrodes, a first high frequency electric power of a same frequency, said frequency having phases which are successively different from one another and wherein said phase differences are substantially equal to one another;
   supplying, to said sample stage, a second high frequency electric power of a second frequency which is different from said first frequency, and
   forming a thin film on a surface of a substrate placed in said vacuum chamber by introducing reaction gas into said vacuum chamber.

* * * * *